(12) United States Patent
Allen et al.

(10) Patent No.: US 7,389,480 B2
(45) Date of Patent: Jun. 17, 2008

(54) CONTENT BASED YIELD PREDICTION OF VLSI DESIGNS

(75) Inventors: Robert J. Allen, Jericho, VT (US); Daria R. Dooling, Huntington, VT (US); Jason D. Hibbeler, Williston, VT (US); Daniel N. Maynard, Craftsbury Common, VT (US); Sarah C. Prue, Richmond, VT (US); Ralph J. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 432 days.

(21) Appl. No.: 10/908,342

(22) Filed: May 9, 2005

(65) Prior Publication Data

US 2006/0253806 A1     Nov. 9, 2006

(51) Int. Cl.
*G06F 17/50*     (2006.01)
(52) U.S. Cl. .............................................. 716/4; 716/19
(58) Field of Classification Search ...................... None
See application file for complete search history.

(56) References Cited

U.S. PATENT DOCUMENTS 5,773,315 A * 6/1998 Jarvis ........................... 438/14
6,317,859 B1 * 11/2001 Papadopoulou ................. 716/4
7,013,441 B2 * 3/2006 Bickford et al. ................. 716/4
2006/0265185 A1 * 11/2006 Lanzerotti et al. ............ 702/181

OTHER PUBLICATIONS

J.Khare et al., "Accurate Estimation of Defect-Related Yield Loss in Reconfigurable VLSI Circuits," IEEE Journal of Solid-State Circuits, vol. 28, No. 2, Feb. 1993, pp. 146-156.*
C.H.Stapper, "Modeling of Integrated Circuit Defect Sensitivities," IBM J. Res. Develop., vol. 27, No. 6, Nov. 1983, pp. 549-557.*
C.H.Stapper et al., "Yield Model for ASIC and Processor Chips," 1993 IEEE Int'l Workshop on Defect and Fault Tolerance in VLSI Systems, pp. 136-143.*

* cited by examiner

*Primary Examiner*—Leigh Marie Garbowski
(74) *Attorney, Agent, or Firm*—Richard M. Kotulak; Hoffman, Warnick & D'Alessandro LLC

(57) ABSTRACT

A system, method and program product for predicting yield of a VLSI design. A method is provided including the steps of: identifying and grouping sub-circuits contained within an integrated circuit design by type; calculating critical area values for regions within the integrated circuit design; and applying different yield models to critical area values based on the types of the regions used to calculate the critical area values, wherein each yield model is dependent on a type.

6 Claims, 3 Drawing Sheets

CONTENT BASED YIELD PREDICTION OF VLSI DESIGNS

TECHNICAL FIELD

The present invention relates generally to predicting yield in VLSI designs, and more specifically relates to a system and method that predicts yield by categorizing and analyzing sub-circuits contained in the VLSI design.

RELATED ART

An important step in the VLSI (very large scale integrated circuit) design process involves predicting manufacturing yield. Manufacturing yield refers to the ratio of good versus defective devices that result during a manufacturing process. Accurately predicting the manufacturing yield ahead of time allows the designers to head off low yielding chip designs prior to any costly manufacturing processes.

There are two traditional models for manufacturing yield prediction of VLSI designs: the circuit model and the critical-area model. The circuit model uses the schematic of a design to produce an estimate based on counts of devices and size and type of embedded memory arrays (see, e.g., C. H. Stapper, J. A. Patric, and R. J. Rosner, "Yield Model for ASIC and Processor Chips," IEEE Workshop on Defect and Fault Tolerance in VLSI Systems, Venice, Italy, Oct. 27-29, 1993). The critical-area model uses geometric analysis of the physical design, independent of circuit function, to produce a yield estimate (see, e.g., C. H. Stapper, "Modeling of Integrated Circuit Defect Sensitivities," IBM Journal of Research and Development, Vol. 27, No. 6, November 1983).

There is a clear need for the ability to refine the circuit-area model by using actual yield estimates from the layout shapes corresponding to different circuit types in the circuit yield model. Because existing approaches require an engineer to subset the chip content into separate pieces to be analyzed, it is extremely laborious to collect enough data to be statistically acceptable. Thus, the number of categories of circuits and functions is forced to be small so it is manageable; and therefore, the accuracy of a yield estimate from critical area analysis and scaling could be increased if a better way to perform such analysis existed.

SUMMARY OF THE INVENTION

The present invention addresses the above-mentioned problems, as well as others, by providing a system and method that predicts yield by categorizing and analyzing sub-circuits contained in the VLSI design. The invention combines existing layout-based yield-prediction methods with a program for identifying sub-circuits of a VLSI design so that the contribution of each sub-circuit to the total yield of the design can be computed for each sub-circuit.

The identification of sub-circuits can be performed in any manner, e.g., interactively, using pattern-recognition techniques, using name matching, etc. Once the design data is divided into constituent parts and the yield contribution of each type of sub-circuit to the overall yield is calculated, the circuit-based yield model can be refined. The invention may also be used to produce a more accurate layout-based yield estimate. Circuit-specific models for yield can be applied based on physical dimensions of sub-circuits in the overall design. The ultimate benefit of either application is that a more accurate yield estimate for the circuit as a whole is obtained. This estimate can then be used to predict wafer starts, for pricing, or as feedback to designer groups.

In a first aspect, the invention provides a method for predicting yield of an integrated circuit design, comprising the steps of: identifying and grouping sub-circuits contained within an integrated circuit design by type; calculating critical area values for regions within the integrated circuit design; and applying different yield models to critical area values based on the types of the regions used to calculate the critical area values, wherein each yield model is dependent on a type.

In a second aspect, the invention provides an integrated circuit yield prediction system, comprising: a system for identifying and grouping sub-circuits contained within an integrated circuit design by type; a critical area calculation system for determining critical area values; a tallying system for calculating a plurality of tallies of critical area values based on type; and a plurality of modeling subsystems for separately modeling each of the plurality of tallies based on type.

In a third aspect, the invention provides a program product stored on a computer readable medium for determining yield of an integrated circuit design, comprising: means for identifying and grouping sub-circuits contained within an integrated circuit design by circuit type; means for calculating critical area values for regions within the integrated circuit design; and means for applying different yield models to critical area values based on the circuit types of the regions used to calculate the critical area values, wherein each yield model is dependent on a circuit type.

BRIEF DESCRIPTION OF THE DRAWINGS

These and other features of this invention will be more readily understood from the following detailed description of the various aspects of the invention taken in conjunction with the accompanying drawings in which.

DETAILED DESCRIPTION OF THE INVENTION

Figure 1:
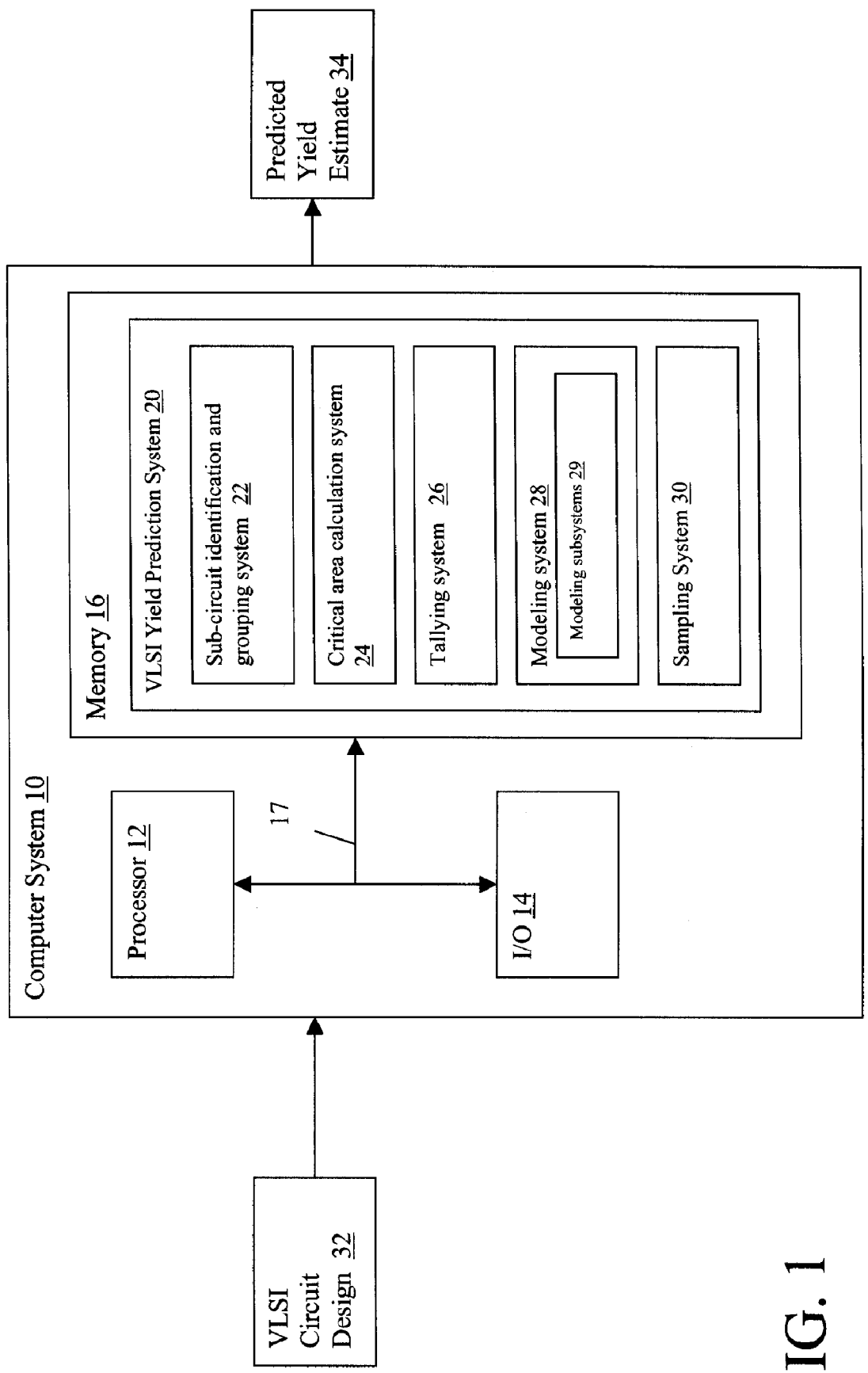
FIG. 1 depicts a computer system having a yield prediction system in accordance with the present invention.

Referring now to the drawings, FIG. 1 depicts a computer system 10 that includes a VLSI yield prediction system 20 for generating a predicted yield estimate 34 based on an inputted VLSI design 32. VLSI yield prediction system 20 may be implemented as a software tool that can implement the processes described herein for generating the predicted yield estimate 34.

In general, computer system 10 may comprise, e.g., a desktop, a laptop, a workstation, etc. Moreover, computer system 10 could be implemented as part of a client and/or a server. Computer system 10 generally includes a processor 12, input/output (I/O) 14, memory 16, and bus 17. The processor 12 may comprise a single processing unit, or be distributed across one or more processing units in one or more locations, e.g., on a client and server. Memory 16 may comprise any known type of data storage, including magnetic media, optical media, random access memory (RAM), read-only memory (ROM), a data cache, a data object, etc.

Moreover, memory 16 may reside at a single physical location, comprising one or more types of data storage, or be distributed across a plurality of physical systems in various forms.

I/O 14 may comprise any system for exchanging information to/from an external resource. External devices/resources may comprise any known type of external device, including a monitor/display, speakers, storage, another computer system, a hand-held device, keyboard, mouse, voice recognition system, speech output system, printer, facsimile, pager, etc. Bus 17 provides a communication link between each of the components in the computer system 10 and likewise may comprise any known type of transmission link, including electrical, optical, wireless, etc. Although not shown, additional components, such as cache memory, communication systems, system software, etc., may be incorporated into computer system 10.

Access to computer system 10 may be provided over a network such as the Internet, a local area network (LAN), a wide area network (WAN), a virtual private network (VPN), etc. Communication could occur via a direct hardwired connection (e.g., serial port), or via an addressable connection that may utilize any combination of wireline and/or wireless transmission methods. Moreover, conventional network connectivity, such as Token Ring, Ethernet, WiFi or other conventional communications standards could be used. Still yet, connectivity could be provided by conventional TCP/IP sockets-based protocol. In this instance, an Internet service provider could be used to establish interconnectivity. Further, as indicated above, communication could occur in a client-server or server-server environment.

In general, VSLI yield prediction system 20 includes: sub-circuit identification and grouping system 22, a critical area calculation system 24, a tallying system 26, a modeling system 28, and a sampling system 30.

Sub-circuit identification and grouping system 22 examines the physical design data contained within VLSI circuit design 32 and then identifies and groups (i.e., categorizes) sub-circuits by type. Sub-circuit types may be distinguished based on any criteria, including but not limited to function, name, location, etc. Classification can be based on any level of complexity, from simple logic circuits to an entire microprocessor core. For instance, sub-circuits may be categorized into types comprising one of: a logic circuit, a memory circuit, or an I/O circuit. However, it should be noted that sub-circuits could be categorized by function at any level, e.g., AND circuits, OR circuits, ROM circuits, RAM circuits, etc. Accordingly, any method and granularity of categorizing sub-circuits based on their functionality could be utilized.

One illustrative technique for categorizing sub-circuits determines circuit types (e.g., logic, memory, I/O) based on a cell-name pattern contained in the cell name that forms the sub-circuit. In this implementation, the sub-circuit identification and grouping system 22 first draws bounding boxes around sub-circuits. It then associates a type to each bounding box based on the cell name of the sub-circuit. Namely, sub-circuit identification and grouping system 22 looks for a pattern match in the cell name with known strings associated with different circuit types. For example, a "logic" type might typically include cell names that include strings such as "AND," "OR," "MUX," etc. Similarly, "memory" types might include cell names that include the strings "ROM" and "RAM." Accordingly, the type of each cell is determined by parsing the cell name to find such a pattern match.

Interactive assignment, by a combination of geographic coordinates and layer, can also be used as a technique for categorizing sub-circuits. For example, using a layout editor, a user can interactively label regions of the circuit by creating and attributing marker shapes.

Another technique would be to use a geometric pattern matching to assign a circuit function from physical layout data. Geographic regions of the VLSI design 32 may be labeled by circuit type. This technique is also easily combined with a sampling framework (discussed below) wherein each sample window of a VLSI design 32 is examined by the pattern-matching program, and a decision is made about what the predominant circuit characteristic is for the window.

Figure 2:
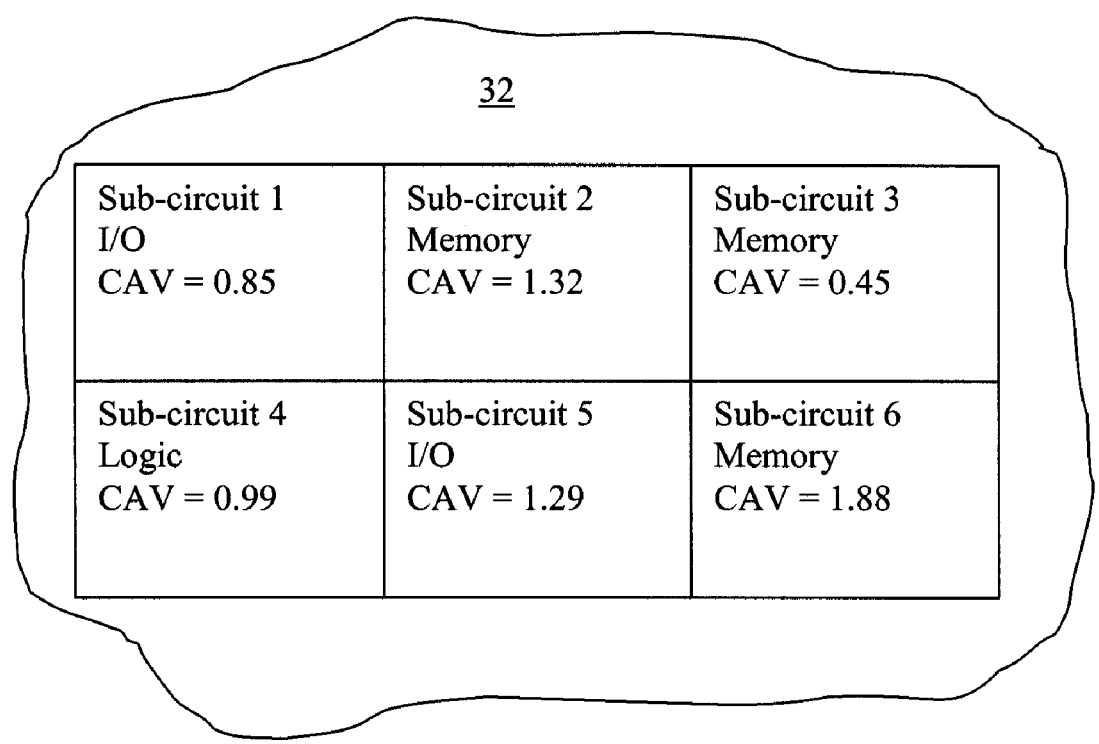
FIG. 2 depicts a portion of VLSI design having sub-circuits identified by type and critical area values calculated for each sub-circuit.

FIG. 2 depicts a portion of an illustrative VLSI circuit design 32 that has been broken up into six sub-circuits, each contained within a bounding box that defines a geographic region. As shown, each sub-circuit has been labeled with a type by sub-circuit identification and grouping system 22, e.g., Memory, I/O or Logic, using a technique such as those described above.

Once the VLSI design 32 has been completely decomposed by geographic region and layer into sub-circuits, critical area calculation system 24 may be employed to calculate a critical area value (CAV) for each sub-circuit. Numerous techniques exist for calculating critical area values, such as that described in C. H. Stapper, "Modeling of Integrated Circuit Defect Sensitivities," IBM Journal of Research and Development, Vol. 27, No. 6, November 1983. The calculation of each critical area value is independent of the circuit function. Illustrative critical area values for each of the six depicted sub-circuits are shown in FIG. 2. Obviously, the critical area values, as well as the layout of the sub-circuits, depicted in FIG. 2 are shown for illustrative purposes. Although not shown, contiguous sub-circuits of the same type could be combined together.

Once the critical area values are determined for each sub-circuit, the values for each type can be tallied (i.e., summed) by tallying system 26 to obtain a total CAV for each type. For instance, the total CAV (i.e., tally) for the different types of circuits may be expressed as:

$$CAV_{Logic} = CAV(\text{Logic sub-circuit}_1) + CAV(\text{Logic sub-circuit}_2) + \ldots$$

$$CAV_{Memory} = CAV(\text{Memory sub-circuit}_1) + CAV(\text{Memory sub-circuit}_2) + \ldots$$

$$CAV_{I/O} = CAV(\text{I/O sub-circuit}_1) + CAV(\text{I/O sub-circuit}_2) + \ldots$$

Modeling system 28 can then apply a unique modeling subsystem 29 (i.e., yield model) to each tally in order to provide yield estimates $Y_{Type}$ for each different type. Once each of the different yield estimates is calculated, they can be combined to generate a predicted yield estimate 34 for the VLSI design 32. For instance, in the above example, modeling system 28 would have three modeling functions ($M_{Logic}$, $M_{Memory}$, $M_{I/O}$), one for each of the logic, memory and I/O tallies. Thus, a predicted yield $Y_{Type}$ for each type could be calculated as follows:

$$Y_{Logic} = M_{Logic}(CAV_{Logic})$$

$$Y_{Memory} = M_{Memory}(CAV_{Memory})$$

$$Y_{I/O} = M_{I/O}(CAV_{I/O}).$$

A final predicted yield estimate 34 could then be calculated as the product of the calculated yields, such as:

$Y=Y_{Logic}*Y_{Memory}*Y_{I/O}.$

Figure 3:
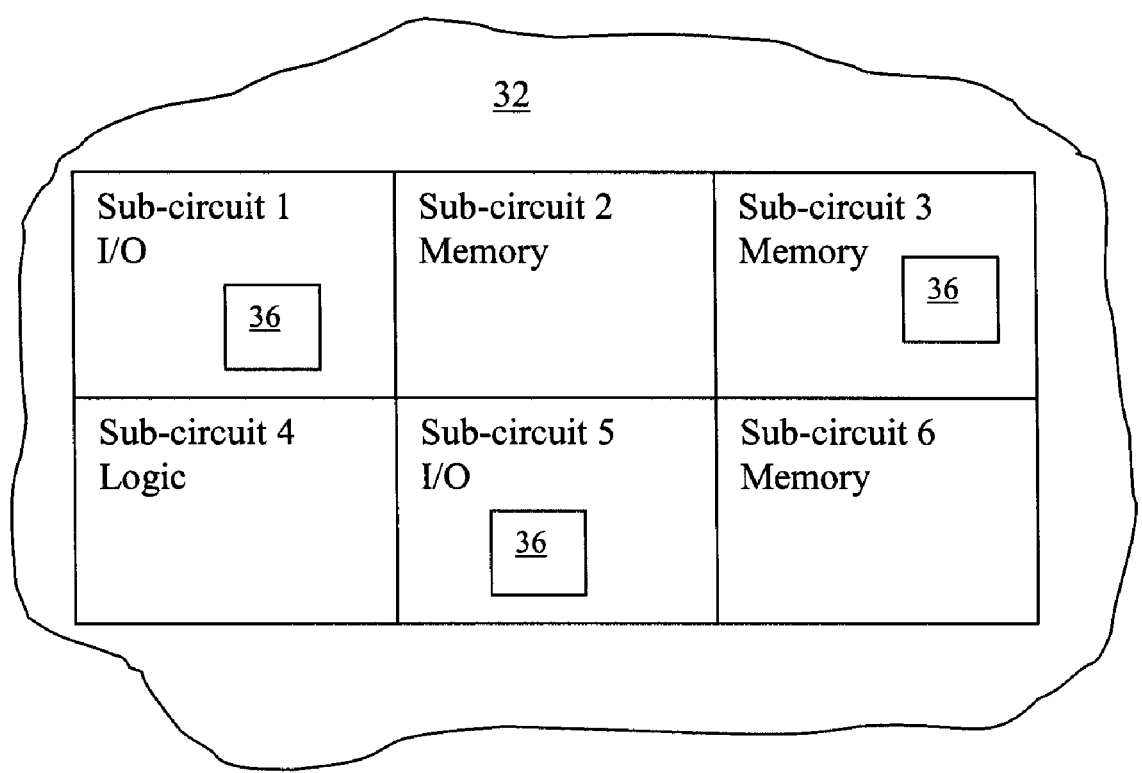
FIG. 3 depicts a portion of VLSI design having sub-circuits identified by type and critical area values calculated for samples.

In an alternative embodiment, a sampling framework using sampling system 30 could be employed. An example of this is shown in FIG. 3. In this embodiment, sub-circuit identification and grouping system 22 would still first be employed to identify and group sub-circuits. However, rather than calculating a critical area value for each identified sub-circuit, sample windows 36 would be chosen from the VLSI design 32. Next, the critical area value for each window 36 would be calculated and added to a tally for the circuit type in which the window 36 falls. Thus, if the window 36 fell in a memory region, then the CAV for the window 36 would be added to the memory tally $CAV_{Memory}$. If the window 36 fell in a logic region, then the CAV for the window 36 would be added to the logic tally $CAV_{Logic}$. If the window 36 fell in an I/O region, then the CAV for the window 36 would be added to the I/O tally $CAV_{I/O}$. This process is then repeated until a sufficient number of samples have been selected. Once complete, each of the tallies $CAV_{Memory}$, $CAV_{Logic}$, and $CAV_{I/O}$ can be separately modeled using an appropriate modeling subsystem 29 and combined, as described above.

Stopping criteria used by the sampling system 30 might include, e.g., statistical measures of whether the estimated overall accuracy is small enough or whether the estimated accuracy of each sub-circuit class is small enough. In this latter case, the selection of sample windows 36 could be guided by the sub-circuit identification and grouping system 22.

Because of the detailed nature of this work it should be noted that any of the above mentioned systems could be run in a task parallel mode thereby reducing computation time.

It should be appreciated that the teachings of the present invention could be offered as a business method on a subscription or fee basis. For example, a computer system 10 comprising VLSI yield prediction system 20 could be created, maintained and/or deployed by a service provider that offers the functions described herein for customers. That is, a service provider could offer to predict yield of a VLSI design as described above.

It is understood that the systems, functions, mechanisms, methods, engines and modules described herein can be implemented in hardware, software, or a combination of hardware and software. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. In a further embodiment, part of all of the invention could be implemented in a distributed manner, e.g., over a network such as the Internet.

The present invention can also be embedded in a computer program product, which comprises all the features enabling the implementation of the methods and functions described herein, and which—when loaded in a computer system—is able to carry out these methods and functions. Terms such as computer program, software program, program, program product, software, etc., in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

The foregoing description of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A method for predicting yield of an integrated circuit design, comprising the steps of:
    identifying and grouping sub-circuits contained within an integrated circuit design by circuit type;
    identifying regions within the integrated circuit design, wherein each region is associated with an identified circuit type;
    calculating critical area values for regions within the integrated circuit design; and
    applying different yield models to critical area values based on the circuit type associated with each region.

2. The method of claim 1, wherein the step of calculating the critical area value for regions includes the steps of:
    calculating the critical area value for each sub-circuit; and
    tallying the critical area values based on circuit type.

3. The method of claim 1, wherein the step of calculating the critical area value for regions includes sampling a section of the integrated circuit design using a window.

4. The method of claim 3, wherein the applying step includes applying the yield model to the circuit type in the window to calculate a yield for the section.

5. The method of claim 4, comprising the further step of continuing sampling until a sufficient number of samples are obtained.

6. The method of claim 1, wherein the circuit types are selected from the group consisting of: memory, input/output (I/O), and logic.

* * * * *